(12) United States Patent
Aga et al.

(10) Patent No.: US 12,313,843 B2
(45) Date of Patent: May 27, 2025

(54) LIGHT SCANNING APPARATUS

(71) Applicants: Hisanori Aga, Tokyo (JP); Yasuyuki Sudo, Tokyo (JP)

(72) Inventors: Hisanori Aga, Tokyo (JP); Yasuyuki Sudo, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 1110 days.

(21) Appl. No.: 16/880,051

(22) Filed: May 21, 2020

(65) Prior Publication Data
US 2020/0371347 A1 Nov. 26, 2020

(30) Foreign Application Priority Data
May 24, 2019 (JP) .............................. JP2019-097795

(51) Int. Cl.
| | |
|---|---|
| G02B 26/10 | (2006.01) |
| G02B 26/08 | (2006.01) |
| H01L 23/532 | (2006.01) |
| H10N 30/87 | (2023.01) |
| H10F 77/20 | (2025.01) |

(52) U.S. Cl.
CPC ....... G02B 26/101 (2013.01); G02B 26/0858 (2013.01); H01L 23/53242 (2013.01); H10N 30/875 (2023.02); *H01L 2224/48599* (2013.01); *H10F 77/254* (2025.01)

(58) Field of Classification Search
CPC .............. G02B 26/0858; G02B 26/101; G02B 26/0833; G02B 26/105; H01L 2224/48599; H01L 23/53242; H01L 31/022491; H10N 30/073; H10N 30/10516; H10N 30/2044; H10N 30/875; H10N 30/883
See application file for complete search history.

(56) References Cited

U.S. PATENT DOCUMENTS

| | | | |
|---|---|---|---|
| 10,481,390 B2 | 11/2019 | Maruyama et al. | |
| 2002/0086456 A1* | 7/2002 | Cunningham | G02B 6/3582 438/57 |
| 2010/0108254 A1* | 5/2010 | Huff | H01L 23/473 164/47 |
| 2011/0292479 A1 | 12/2011 | Hiraoka et al. | |
| 2012/0212108 A1 | 8/2012 | Nakamura | |

(Continued)

FOREIGN PATENT DOCUMENTS

| | | |
|---|---|---|
| CN | 101852917 | 10/2010 |
| JP | H01-216257 | 8/1989 |

(Continued)

OTHER PUBLICATIONS

Todeschini et al. "Influence of Ti and Cr adhesion Layers on Ultrathin Au Films." ACS Applied Materials & Interfaces, vol. 9, No. 42, Oct. 2, 2017, p. 37374-37385.*

(Continued)

*Primary Examiner* — Holly Rickman
*Assistant Examiner* — Lisa Chau
(74) *Attorney, Agent, or Firm* — IPUSA, PLLC

(57) ABSTRACT

A light scanning apparatus for causing a mirror to oscillate to scan with light reflected by the mirror includes an interconnect formed of gold; a protective film for covering the interconnect; and an adhesive film formed between the interconnect and the protective film.

7 Claims, 5 Drawing Sheets

(56) References Cited

U.S. PATENT DOCUMENTS

2013/0069095 A1* 3/2013 Hodota .................. H01L 33/42
                                                    257/E33.072
2018/0088321 A1* 3/2018 Maruyama ............ B81B 3/0072

FOREIGN PATENT DOCUMENTS

| JP | H08-255796     |   | 10/1996 |
|----|----------------|---|---------|
| JP | 2007-059583    |   | 3/2007  |
| JP | 2010-122480    |   | 6/2010  |
| JP | 2012-174955    |   | 9/2012  |
| JP | 2013-033869    |   | 2/2013  |
| JP | 2013033869 A   | * | 2/2013  |
| JP | 2013083769 A   | * | 5/2013  |
| JP | 5779472        |   | 9/2015  |
| JP | 2016-009050    |   | 1/2016  |
| JP | 2018-054908    |   | 4/2018  |
| JP | 2018-125407    |   | 8/2018  |
| JP | 2018-128505    |   | 8/2018  |

OTHER PUBLICATIONS

Office Action mailed on Dec. 6, 2022 with respect to the corresponding Japanese patent application No. 2019-097795.
Office Action mailed on Feb. 21, 2023 with respect to the corresponding Japanese patent application No. 2019-097795.

* cited by examiner

FIG.5

| | Ag | Cu | Au | Fe | SiO$_2$ | Ti | Pt | Al$_2$O$_3$ | W |
|---|---|---|---|---|---|---|---|---|---|
| COEFFICIENT OF THERMAL EXPANSION [10$^{-6}$/K] | 19.0 | 16.7 | 14.3 | 11.9 | 10.3 | 8.5 | 8.8 | 5.4 | 4.5 |

LIGHT SCANNING APPARATUS

CROSS-REFERENCE TO RELATED APPLICATION

This application claims priority under 35 U.S.C. § 119 to Japanese Patent Application No. 2019-097795, filed May 24, 2019, the contents of which are incorporated herein by reference in their entirety.

BACKGROUND OF THE INVENTION

1. Field of the Invention

The present disclosure relates to a light scanning apparatus.

2. Description of the Related Art

Light scanning apparatuses are known to bidimensionally scan with laser light, while causing a mirror to oscillate about a horizontal rotation axis and a vertical rotation axis. Such a light scanning apparatus is MEMS (Micro Electro Mechanical Systems) that drives a mirror with an actuator such as a piezoelectric element.

The light scanning apparatus is used, as a so-called open package, in various environments, from the viewpoint of exposing the mirror. In this case, an interconnect for supplying a drive voltage to the actuator is desirably to be formed of material having increased thermal resistance and corrosion resistance. As such an interconnect, for example, a gold interconnect is used, and a protective film formed of aluminum oxide or the like is formed on the gold interconnect (see, e.g., Japanese Unexamined Patent Application No. 2018-54908 that is hereinafter referred to as Patent document 1).

SUMMARY

According to disclosed techniques, a light scanning apparatus for causing a mirror to oscillate to scan with light reflected by the mirror is provided, including an interconnect formed of gold; a protective film for covering the interconnect; and an adhesive film formed between the interconnect and the protective film.

BRIEF DESCRIPTION OF THE DRAWINGS

FIG. 5 is a table illustrating coefficients of thermal expansion for various metals.

DESCRIPTION OF THE EMBODIMENTS

Related art information relevant to the present disclosure recognized by the inventors of this application will be provided below. For the light scanning apparatus described in Patent document 1, when the gold interconnect is used to supply the drive voltage to the actuator, there may be a problem about the protective film separating from the gold interconnect, because the gold interconnect has decreased adhesion to the protective film formed of aluminum oxide or the like. In this regard, it is confirmed by the inventors that the protective film is separated from the interconnect, due to heat that is applied in the environment where the light scanning apparatus is used; or an external force that is applied to a wafer in a dicing process during manufacturing.

In view of the issue described above, techniques in the present disclosure provide a light scanning apparatus whereby it is possible to reduce separation of the protective film from the interconnect.

Figure 1:
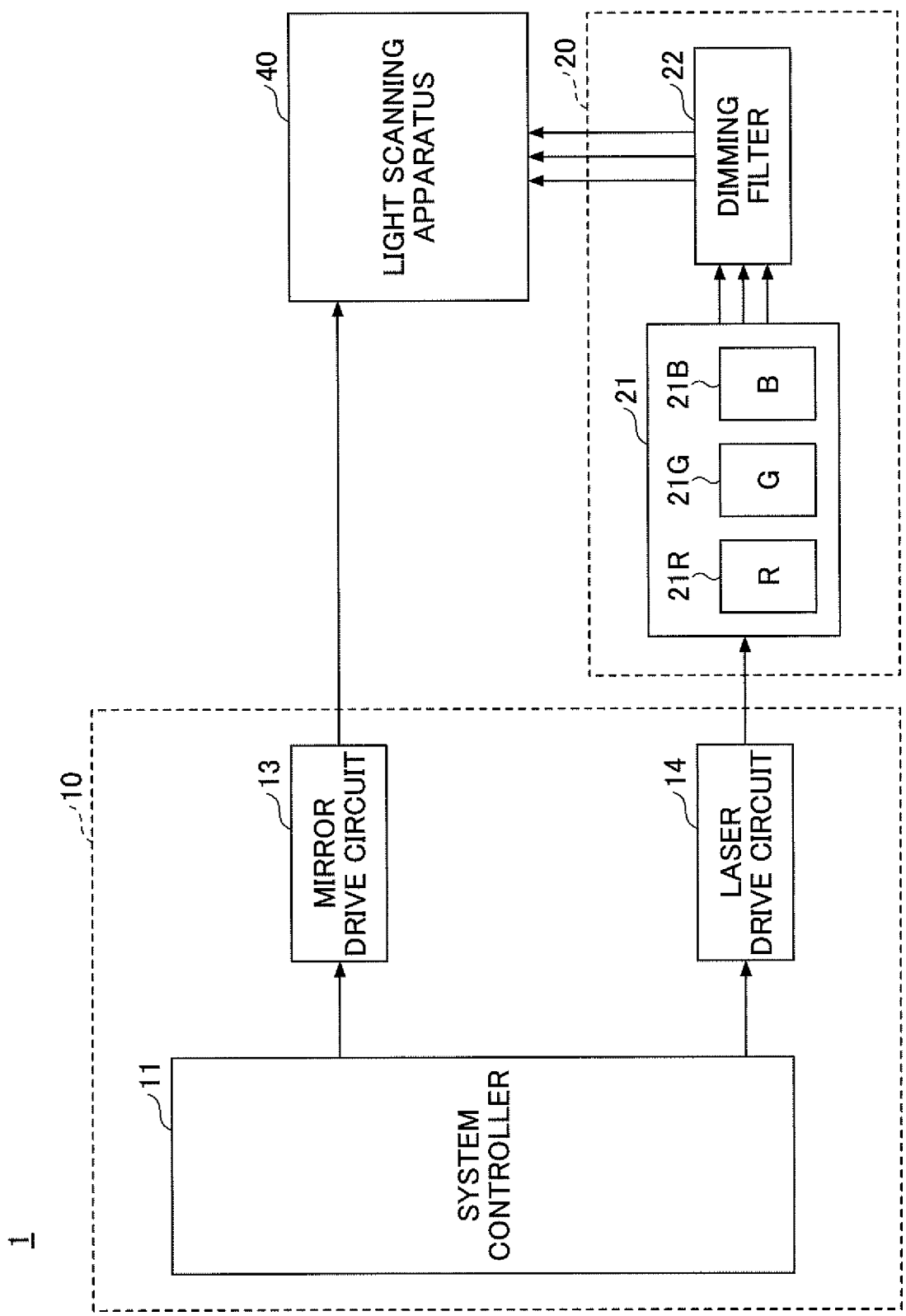
FIG. 1 is a diagram schematically illustrating an example of a configuration of a light scanning apparatus according to one embodiment.

One or more embodiments of the present disclosure will be hereinafter described with reference to the drawings. FIG. 1 is a diagram schematically illustrating an example of a configuration of a light scanning system according to one embodiment.

According to the present embodiment, the light scanning system 1 includes a light scanning controller 10, a light source 20, and a light scanning apparatus 40. Each component will be described below.

The light scanning controller 10 includes a system controller 11, a mirror drive circuit 13, and a laser drive circuit 14. The light scanning controller 10 controls the light source 20 and the light scanning apparatus 40.

The system controller 11 supplies, to the mirror drive circuit 13, a drive signal (drive voltage) for controlling oscillating of a mirror provided in the light scanning apparatus 40. Further, the system controller 11 supplies a digital video signal to the laser drive circuit 14.

The mirror drive circuit 13 is a mirror drive unit that supplies a horizontal drive signal and a vertical drive signal to the light scanning apparatus 40, based on a control signal from the system controller 11. Where, the horizontal drive signal is for driving the mirror described below in a horizontal direction to cause the mirror to oscillate about a horizontal oscillation-axis, and the vertical drive signal is for driving the mirror in a vertical direction to cause the mirror to oscillate about a vertical oscillation-axis.

The laser drive circuit 14 supplies a laser drive signal for driving a laser, to the light source 20, based on the video signal from the system controller 11.

The light source 20 includes an LD (laser diode) module 21 and a dimming filter 22. The LD module 21 includes a laser 21R, a laser 21G, and a laser 21B.

The lasers 21R, 21G, and 21B emit laser lights based on a laser drive current applied from the system controller 11. The laser 21R is, for example, a red semiconductor laser and emits light having a wavelength λR (e.g., 640 nm). The laser 21G is, for example, a green semiconductor laser and emits light having a wavelength λG (e.g., 530 nm). The laser 21G is, for example, a blue semiconductor laser and emits light having a wavelength λB (e.g., 445 nm). The respective lights having wavelengths emitted from the lasers 21R, 21G, and 21B are synthesized by a dichroic mirror or the like. Then, a synthesized light is dimmed by the dimming filter 22 to have a predetermined light amount, and enters the light scanning apparatus 40.

The light scanning apparatus 40 drives the mirror in the horizontal direction and the vertical direction, in accordance with the horizontal drive signal and the vertical drive signal that are supplied by the mirror drive circuit 13. In such a manner, the light scanning apparatus 40 varies a direction of light reflected with respect to emitted laser light, while scanning with laser light. Thereby, the light scanning apparatus 40 projects an image on a screen or the like.

Figure 2:
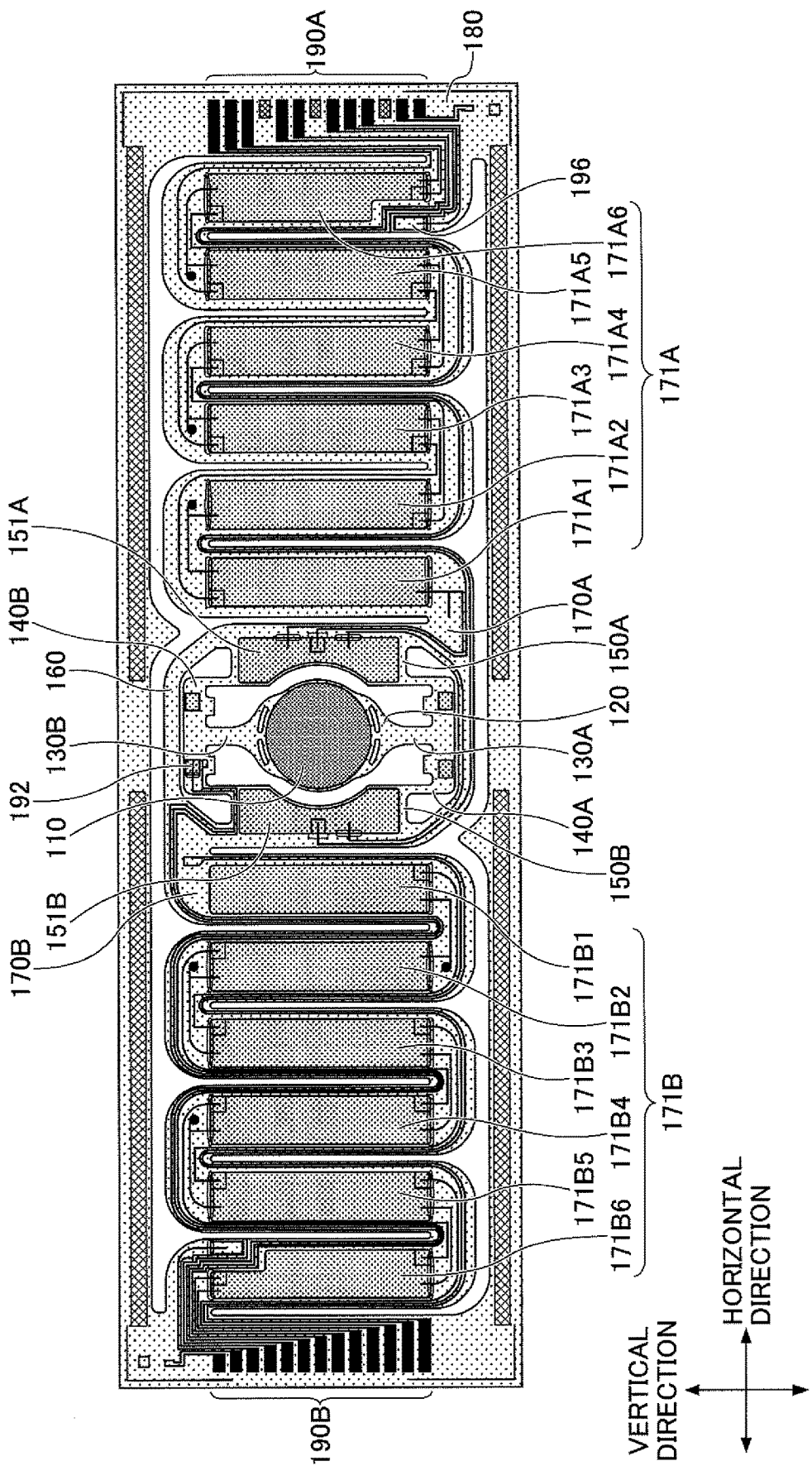
FIG. 2 is a diagram illustrating an example of the light scanning apparatus.

FIG. 2 is a diagram illustrating an example of a configuration of the light scanning apparatus 40. The light scanning apparatus 40 is MEMS that drive the mirror 110 by an actuator including a piezoelectric element, for example.

The light scanning apparatus 40 includes the mirror 110; a mirror support 120; torsion beams 130A and 130B; and connection beams 140A and 140B. Further, the light scanning apparatus 40 includes first drive beams 150A and 150B; a movable frame 160; second drive beams 170A and 170B; and a fixing frame 180. The first drive beams 150A and 150B include drive sources 151A and 151B, respectively. The second drive beams 170A and 170B include drive sources 171A and 171B, respectively. The first drive beams 150A and 150B, as well as the second drive beams 170A and 170B, cause the mirror 110 to oscillate up and down or left and right, to thereby scan with laser light.

In the light scanning apparatus 40, the mirror 110 is supported on an upper surface of the mirror support 120, and the mirror support 120 is connected at ends of the torsion beams 130A and 130B that are on both sides of the mirror support 120. The torsion beams 130A and 130B serve as an oscillation axis. The torsion beams 130A and 130B extend in an axial direction, and support the mirror support 120 at opposite sides of the axial direction. According to torsion of the torsion beams 130A and 130B, the mirror 110 supported by the mirror support 120 oscillates, while performing operation to scan with light reflected by the mirror 110. The torsion beams 130A and 130B are coupled with the connection beams 140A and 140B, respectively, so as to be supported by the connection beams 140A and 140B. The torsion beams 130A and 1308 are respectively connected to the first drive beams 150A and 150B, via the connection beams 140A and 140B.

The first drive beams 150A and 150B, the connection beams 140A and 140B, the torsion beams 130A and 130B, the mirror support 120, and the mirror 110 are each outwardly supported by the movable frame 160. One side of each of the first drive beams 150A and 150B is supported by the movable frame 160. The other side of the first drive beam 150A extends inward and is connected to the connection beams 140A and 140B. Similarly, the other side of the first drive beam 150B extends inward and is connected to the connection beams 140A and 140B.

The first drive beams 150A and 150B are paired so as to interpose the mirror 110 and the mirror support 120, in a direction perpendicular to the torsion beams 130A and 130B. The drive sources 151A and 151B are formed on upper surfaces of the first drive beams 150A and 150B, respectively. Each of the drive sources 151A and 151B is a piezoelectric element that includes a piezoelectric thin film; an upper electrode formed on the piezoelectric thin film; and a lower electrode formed below the piezoelectric thin film. Each of the drive sources 151A and 151B extends or contracts according to a drive voltage applied to a corresponding upper electrode and a corresponding lower electrode.

In such a manner, when drive voltages set at reversed polarities are alternately applied between the first drive beam 150A and the first drive beam 150B, the first drive beam 150A and the first drive beam 150B alternately vibrate vertically in opposite directions, on right and left sides of the mirror 110. Thereby, the mirror 110 can oscillate about an axis being an oscillation axis or a rotation axis that is served by the torsion beams 130A and 130B.

A direction of the mirror 110 that oscillates about an axis served by the torsion beams 130A and 130B is hereafter referred to as a horizontal direction. In the present embodiment, by deforming the torsion beams 130A and 130B, the first drive beam 150A and the first drive beam 150B cause the mirror 110 to oscillate in the horizontal direction. For example, a resonant vibration is used in horizontal driving through the first drive beams 150A and 150B. In this case, the mirror 110 can be driven to oscillate at a high speed.

One end of each of the second drive beams 170A and 170B is connected to an outer portion of the movable frame 160. The second drive beams 170A and 170B are paired so as to interpose the movable frame 160 at both sides of the movable frame. The second drive beams 170A and 170B support the movable frame 160 at both sides of the movable frame, and cause the movable frame 160 to oscillate about a predetermined axis that passes through the center of a surface on which light is reflected. The second drive beam 170A has a zigzag shape as a whole in which each of multiple (e.g., even number) rectangular beams extending parallel to the first drive beam 150A is connected at ends of adjacent rectangular beams.

The other end of the second drive beam 170A is connected to the inside of the fixing frame 180. Similarly, the second drive beam 170B has a zigzag shape as a whole in which each of multiple (e.g., even number) rectangular beams extending parallel to the first drive beam 150B is connected at ends of adjacent rectangular beams. The other end of the second drive beam 170B is connected to the inside of the fixing frame 180.

The drive sources 171A and 171B are respectively formed on upper surfaces of the second drive beams 170A and 1708, each of which includes rectangular units each not including a curved portion. Each of the drive sources 171A and 171B is a piezoelectric element that includes a piezoelectric thin film; an upper electrode formed on the piezoelectric thin film; and a lower electrode formed below the piezoelectric thin film.

With respect to the second drive beams 170A and 170B, when drive voltages set at reversed polarities are respectively applied to the drive sources 171A and 171B each of which includes adjacent rectangular units, the adjacent rectangular beams deflect vertically in opposite directions. Thereby, the resultant force caused by the vertically deflected rectangular beams is applied to the movable frame 160.

With such a force being applied, the second drive beams 170A and 170B cause the mirror 110 to oscillate in a vertical direction perpendicular to the horizontal direction. In this example, the second drive beams 170A and 170B serve as vertical beams that cause the mirror 110 to oscillate in the vertical direction. In other words, in the present embodiment, with the second drive beams 170A and 170B bending and deforming, the mirror 110 oscillates in the vertical direction. For example, a non-resonant vibration is used in vertical driving through the second drive beams 170A and 170B.

The drive source 171A includes drive sources 171A1, 171A2, 171A3, 171A4, 171A5, and 171A6 that are disposed in this order toward a right direction with respect to the movable frame 160. Further, the drive source 171B includes drive sources 171B1, 171B2, 171B3, 171B4, 171B5, and 171B6 that are disposed in this order toward a left direction with respect to the movable frame 160.

Drive interconnects for applying drive voltages to the drive source 151A are connected to predetermined terminals included in a terminal group 190A that is disposed in the fixing frame 180. Drive interconnects for applying drive voltages to the drive source 151B are connected to predetermined terminals included in a terminal group 190B that is disposed in the fixing frame 180.

Further, drive interconnects for applying driving voltages to the drive source 171A are connected to predetermined terminals included in the terminal group 190A that is disposed in the fixing frame 180. Driving interconnects for applying drive voltages to the drive source 171B are connected to predetermined terminals included in the terminal group 190B that is disposed in the fixing frame 180.

The light scanning apparatus 40 includes a first sensor 192. The first sensor 192 outputs a signal in accordance with a deflection angle at which the mirror 110 is oriented with respect to the horizontal direction, when the drive voltages are applied to the drive sources 151A and 151B so that the mirror 110 thereby oscillates in the horizontal direction. The first sensor 192 includes a piezoelectric sensor and is disposed in the connection beam 140B.

The light scanning apparatus 40 includes a second sensor 196. The second sensor 196 outputs a signal in accordance with a deflection angle at which the mirror 110 is oriented with respect to the vertical direction, when the drive voltages are applied to the drive sources 171A and 171B so that the mirror 110 thereby oscillates in the vertical direction. The second sensor 196 includes a piezoelectric sensor and is disposed in a given one rectangular beam in the second drive beam 170B.

In accordance with the mirror 110 being oriented with respect to the horizontal direction, the first sensor 192 outputs a signal corresponding to displacement of the connection beam 140B, the displacement being transferred by the torsion beam 130B. The second sensor 196 outputs a signal corresponding to displacement of a given rectangular beam in which the second sensor 196 is disposed and which is disposed in the second drive beam 170A.

The piezoelectric sensor used as each of the first sensor 192 and the second sensor 196 includes an upper electrode that is formed on an upper surface of a piezoelectric thin film, and includes a lower electrode formed on a lower surface of the piezoelectric thin film. Sensor interconnects drawn from the upper electrode and the lower electrode of the piezoelectric sensor used as the first sensor 192 are connected to predetermined terminals included in the terminal group 190B that is disposed in the fixing frame 180. Further, sensor interconnects drawn from the upper electrode and the lower electrode of the piezoelectric sensor used as the second sensor 196 are connected to predetermined terminals included in the terminal group 190A that is disposed in the fixing frame 180.

As described above, the light scanning apparatus 40 in such a configuration is used, as a so-called open package, in various environments, from the viewpoint of exposing the mirror 110.

Figure 3:
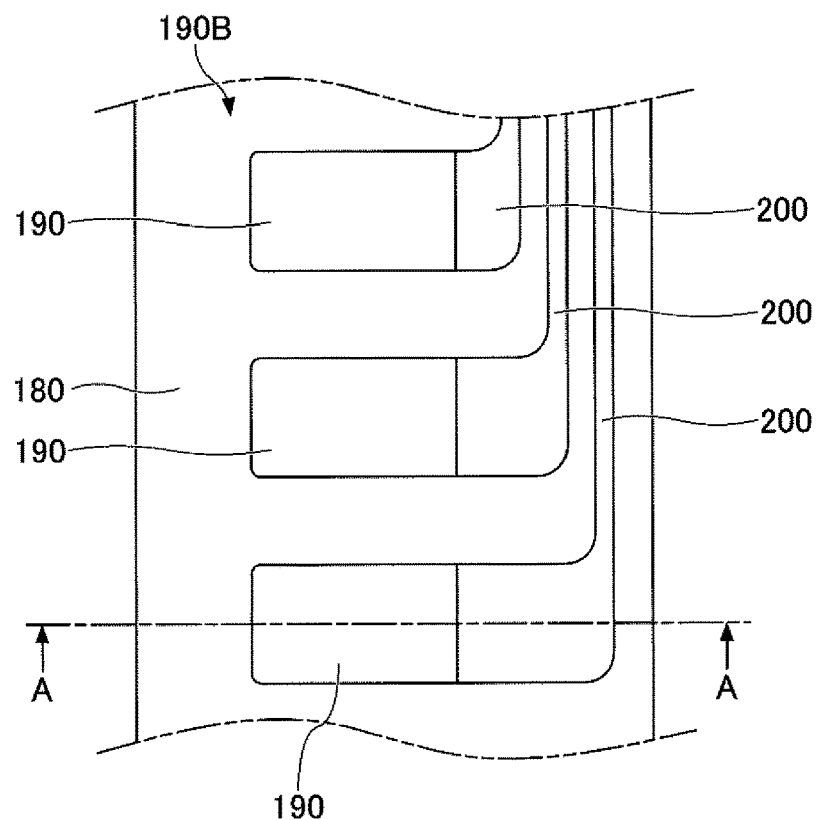
FIG. 3 is a plan view of a portion of a terminal group formed above a fixing frame.
Figure 4:
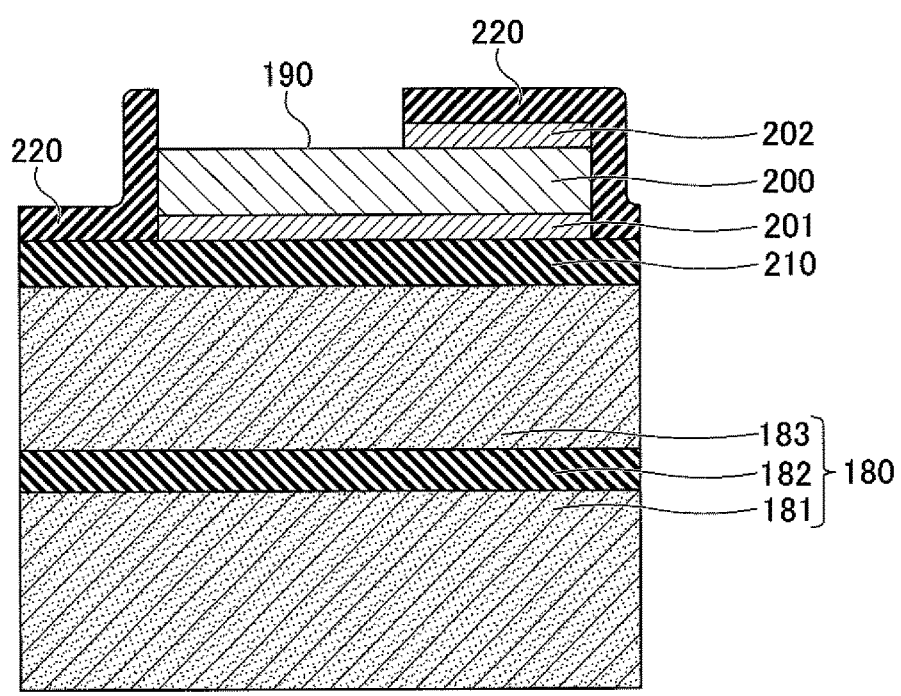
FIG. 4 is a cross-section view taken along the A-A line in FIG. 3.

FIG. 3 is a plan view of a portion of the terminal group 190B formed in the fixing frame 180. FIG. 4 is a cross-section view taken along the A-A line in FIG. 3. In FIGS. 3 and 4, each interconnect 200 is the drive interconnect or the sensor interconnect described above.

As illustrated in FIG. 4, for example, the fixing frame 180 is formed with an SOI (Silicon on Insulator) substrate in which a support substrate 181 formed of silicon (Si), a BOX (Buried Oxide) layer 182, and a silicon active layer 183 are laminated in this order.

An insulating film 210 made of, for example, silicon dioxide ($SiO_2$) is formed on the fixing frame 180. The insulating film 210 is not limited to a single insulating film, and may be formed by two or more insulating films that are laminated.

Each interconnect 200 is formed on the insulating film 210 and in a region where a corresponding interconnect from among the above drive interconnects and sensor interconnects is formed. Specifically, the interconnect 200 is formed above the insulating film 210 via a base film 201. An adhesive film 202 is formed on the interconnect 200. The base film 201, the interconnect 200, and the adhesive film 202 are formed with a multilayer film that is patterned by photolithography, where the multilayer film is laminated on the insulating film 210 and is formed by sputtering, electron beam evaporation, or the like. The base film 201, the interconnect 200, and the adhesive film 202 each have an approximately same planar configuration.

As described above, the light scanning apparatus 40 is used, as a so-called open package, in the various environments. In such a manner, the interconnects 200 are preferably formed of material having increased heat resistance and corrosion resistance. In the present embodiment, each interconnect 200 is a gold interconnect whose material is gold (Au). Note that each interconnect 200 is formed with a single layer and connects a corresponding terminal included in the terminal groups 190A and 190B, to either of a corresponding piezoelectric element (which is selected from among the drive sources 151A and 151B and the drive sources 171A and 171B) or a corresponding sensor (which is selected from among the first sensor 192 and second sensor 196). In the present embodiment, the interconnects 200 are each disposed not only above the fixing frame 180 but also on or above one or more corresponding components from among the movable frame 160; the first drive beams 150A and 150; the second drive beams 170A and 170B; and the like.

The base film 201 is formed of a metallic material having a high melting point, such as an alloy containing titanium (Ti). The base film 201 is preferably formed of, for example, titanium tungsten (TiW) and has a composition ratio of Ti:W=30:70 [at %], for example. The base film 201 has an effect of increasing adhesion between a given interconnect 200 being the gold interconnect and the insulating film 210.

As is the case with the base film 201, the adhesive film 202 is formed of a metallic material having a high melting point, such as an alloy containing titanium (Ti). The adhesive film 202 is preferably formed of, for example, titanium tungsten (TiW), and has a composition ratio of Ti:W=30:70 [at %], for example. Note that the adhesive film 202 has an effect of increasing adhesion between a given interconnect 200 being the gold interconnect and the protective film 220.

Note that in the present embodiment, the base film 201 and the adhesive film 202 each contact the interconnect 200. In this case, because the base film 201 and the adhesive film 202 each have higher resistance than the interconnect 200, the base film 201 and the adhesive film 202 do not serve as interconnects (signal lines).

The adhesive film 202 covers the interconnect 200 so as to be partially removed from an end portion of the interconnect 200. The end portion of the interconnect 200 where the adhesive film 202 is removed serves as a given terminal 190 included in the terminals 190A and 190.

The protective film 220 approximately covers all areas in the light scanning apparatus 40. Note that the protective film 220 is removed in a portion where each terminal 190 is formed. The protective film 220 is an insulating film formed of aluminum oxide (alumina: $Al_2O_3$), for example.

FIG. 5 is a table illustrating coefficients of thermal expansion for various metals. As illustrated in FIG. 5, the coefficient of thermal expansion of titanium (Ti) included in the adhesive film 202 is about $8.5 \times 10^{-6}$/K, and is a value between the coefficient of thermal expansion (about $14.3 \times 10^{-6}$/K) of gold (Au) that constitutes the interconnect 200 and the coefficient of thermal expansion (about $5.4 \times 10^{-6}$/K) of aluminum oxide ($Al_2O_3$) that constitutes the protective film 220. Thus, the adhesive film 202 has an effect of reducing separation of the protective film 220 due to a difference in the coefficient of thermal expansion between the interconnect 200 and the protective film 220.

For the adhesive film 202, it is considered that titanium (Ti) contained in the adhesive film 202 is oxidized to form a compound, and that the compound bonds with oxygen in aluminum oxide that constitutes the protective film 220 formed of aluminum oxide, which results in improvement of adhesion to the protective film 220. Further, it is considered that the adhesive film 202 includes titanium (Ti) that easily diffuses into gold (Au) that constitutes the interconnect 200, which results in improvement of adhesion to the interconnect 200.

As described above, when the protective film 220 is formed above the interconnect 200 via the adhesive film 202, separation of the protective film 220 caused by heat that is applied in the environment in which the light scanning apparatus 40 is used is inhibited. The light scanning apparatus 40 is manufactured using a wafer such as an SOI substrate. Specifically, a plurality of light scanning apparatuses 40 are formed on the wafer, and then the wafer is cut in a dicing process (wafer cutting process), so that the wafer is separated into individual light scanning apparatuses. In the dicing process, separation of the protective film 220 due to an external force that is applied to the wafer is inhibited.

Comparative Example

A comparative example to the above embodiment will be described below. According to the comparative example, a light scanning apparatus in which the adhesive film 202 was removed from the light scanning apparatus 40 that has been described above, and in which the protective film 220 was formed directly on the interconnects 200, was manufactured by using the above wafer. Then, the presence or absence of separation of the protective film 220 due to heat or an external force was checked by the inventors.

As a result, the separation of the protective film 220 was checked for a given element (light scanning apparatus) that was located at the center and the periphery of the wafer. A percentage of elements for each of which the protective film 220 was separated, relative to all elements present in the wafer, was about 22%.

Figure 6:
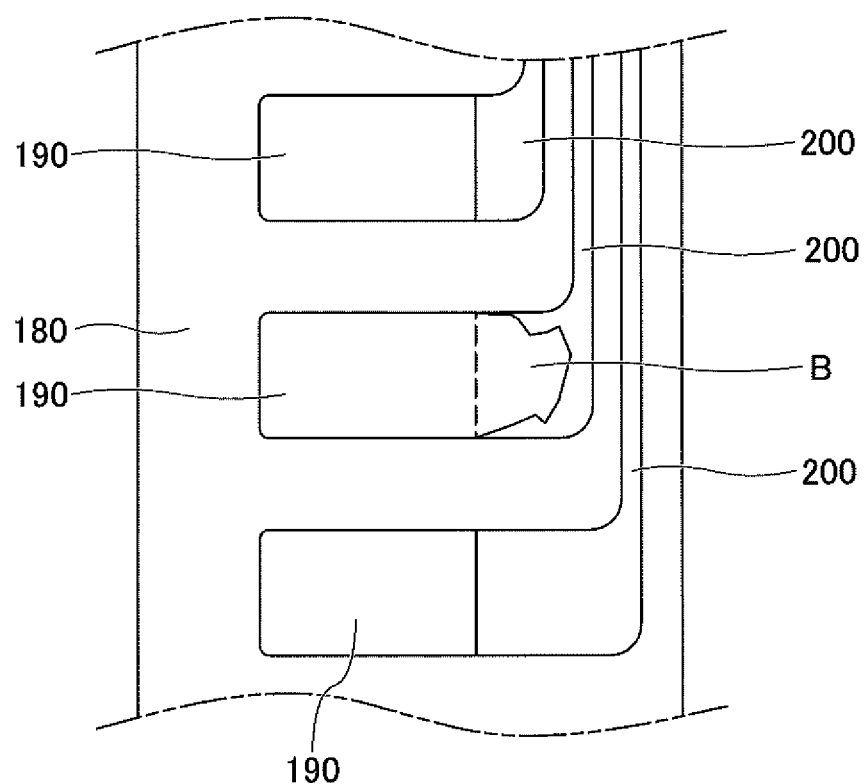
FIG. 6 is a diagram illustrating an example of a part where a protective film was separated in a comparative example.

FIG. 6 is a diagram illustrating a part where the protective film 220 was separated in the comparative example. As illustrated in FIG. 6, the separation of the protective film 220 occurred in an area B that adjoins a given terminal 190 and that is above the interconnect 200. In such a manner, the protective film 220 is separated from an end portion of the terminal, there is concern with this being accompanied by expansion of the area in which the protective film 220 is separated.

Further, in a similar manner to the comparative example, the light scanning apparatus 40 including the adhesive film 202 between the interconnect 200 and the protective film 220 was manufactured. Then, the presence or absence of separation of the protective film 220 was checked by the inventors. As a result, in the case of the adhesive film 202 being present, it was confirmed that separation of the protective film 220 did not occur in all elements present in a wafer.

Modification

Modification of the embodiment will be described below.

In the above embodiment, the adhesive film 202 and the base film 201 are each formed of an alloy containing titanium (e.g., TiW). However, each of the adhesive film 202 and the base film 201 may not be formed of a titanium alloy. For example, each of the adhesive film 202 and the base film 201 may be formed of only titanium (Ti).

Note that the material of the adhesive film 202 is not limited to a titanium-based metal. Preferably, the coefficient of thermal expansion of the adhesive film 202 is a value between the coefficient of thermal expansion of the interconnect 200 and the coefficient of thermal expansion of the protective film 220; and, the adhesive film 202 has a substance having an interaction between the interconnect 200 and the protective film 220. It is assumed by the inventors that items (1) to (4) below relate to the interaction between two substances, which contributes to adhesion.

(1) Lattice constants are close.
(2) A thermodynamically stable compound is formed in proximity to an interface.
(3) Both metals are atomically diffused in proximity to an interface.
(4) An anchor effect is obtained.

For item (1), as material having a lattice constant that is close to a lattice constant of $4.07 \times 10^{-10}$, for gold (Au), aluminum (Al) having a lattice constant of $4.05 \times 10^{-10}$; silver (Ag) having a lattice constant of $4.08 \times 10^{-10}$; or the like is taken.

For item (2), a case where both metals are mixed in proximity to the interface; or a case where oxide is formed as a compound in proximity to the interface is taken.

For item (3), a case where, for both metals in proximity to the interface, respective composition ratios vary atomically gradually in a thickness direction is taken. Examples of material that is easily diffused include titanium (Ti), chromium (Cr), nickel (Ni), copper (Cu), and the like.

For item (4), the anchor effect refers to an effect of increasing adhesion that penetrates through unevenness formed at interfaces with a given interconnect and the protective film.

When the interconnect 200 is formed of gold (Au) and the protective film 220 is formed of aluminum oxide ($Al_2O_3$), in a case where the adhesive film 202 is formed of a titanium-based metal, it is assumed that the coefficient of thermal expansion of the adhesive film 202, as well as at least one interaction selected from among items (2) to (4), result in an increase in the adhesion.

The protective film 220 is not limited to being formed of aluminum oxide ($Al_2O_3$), and may be formed of other materials. For example, the protective film 220 may be formed of an inorganic oxide ($SiO_2$, $SnO_2$, $TiO_2$, $Y_2O_3$, $SrTiO_3$, or the like) other than aluminum oxide ($Al_2O_3$). Alternatively, the protective film 220 may be formed of an inorganic nitride (SiN, TiN, AlN, or the like). The protective film 220 may be formed of an inorganic fluoride (MgF or the like). In addition, the protective film 220 may be an inorganically amorphous film.

In the embodiments, the light scanning apparatus 40 resonantly drives in the horizontal direction, and non-resonantly drives in the vertical direction, but is not limited thereto. For example, as the light scanning apparatus 40, a light scanning apparatus that non-resonantly drives in both of the horizontal direction and the vertical direction can be taken.

The light scanning apparatus according to the embodiments can be applied to a light scanning apparatus that scans bidimensionally, such as in a head mounted display, a head-up display, or a projector.

One or more embodiments have been described above. However, the present disclosure is not limited to the aspects described in the embodiments. Modifications can be made within a scope of the present disclosure. Various aspects can be taken according to an application of a given light scanning apparatus.

What is claimed is:

1. A light scanning apparatus for causing a mirror to oscillate to scan with light reflected by the mirror, the light scanning apparatus comprising:
    an insulating film;
    a base film disposed on the insulating film, and including titanium;
    an interconnect disposed on the base film, the interconnect being formed of gold;
    a protective film for covering the interconnect; and
    an adhesive film formed between the interconnect and the protective film,
    wherein the interconnect includes an end portion, the end portion including a region that serves as a terminal, and the end portion having a surface exposed through an opening that is provided by removing both a portion of the adhesive film and a portion of the protective film,
    wherein the adhesive film includes a first edge surface, and the protective film includes a second edge surface,
    wherein the first edge surface and the second edge surface are obtained with the removal of the portion of the adhesive film and the portion of the protective film,
    wherein the first edge surface is aligned with the second edge surface as viewed in a direction perpendicular to an exposed surface of the end portion in the interconnect,
    wherein the protective film is formed of an inorganic oxide,
    wherein the adhesive film includes titanium that is oxidized with the inorganic oxide in the protective film to form a compound, the compound bonding with oxygen that is included in the inorganic oxide,
    wherein the adhesive film is coupled to the interconnect upon occurrence of a condition in which the titanium in the adhesive film is diffused into the gold in the interconnect, and
    wherein the base film contacts the insulating film and the interconnect.

2. The light scanning apparatus according to claim 1, wherein the adhesive film has a coefficient of thermal expansion that is a value between a coefficient of thermal expansion of the interconnect and a coefficient of thermal expansion of the protective film.

3. The light scanning apparatus according to claim 1, wherein the adhesive film is formed of titanium tungsten.

4. The light scanning apparatus according to claim 1, wherein the protective film is formed of aluminum oxide.

5. The light scanning apparatus according to claim 1, wherein the interconnect is a drive interconnect electrically coupled to a piezoelectric element as a drive source that drives the mirror.

6. The light scanning apparatus according to claim 1, wherein the interconnect is a sensor interconnect electrically coupled to a sensor that outputs a signal according to an angle at which the mirror is oriented.

7. The light scanning apparatus according to claim 1, further comprising:
    a mixed region at a first interface where the interconnect contacts the adhesive film, the mixed region including the gold constituting the interconnect and a material included in the adhesive film; and
    a region at a second interface where the protective film contacts the adhesive film, the region including the compound,
    wherein the adhesive film has a coefficient of thermal expansion that is a value between a coefficient of thermal expansion of the interconnect and a coefficient of thermal expansion of the protective film.

* * * * *